United States Patent [19]
Singer

[11] Patent Number: 5,897,180
[45] Date of Patent: Apr. 27, 1999

[54] RESILIENT PANEL FOR HOUSING A MACHINE

[75] Inventor: Richard Singer, Menlo Park, Calif.

[73] Assignee: Silicon Graphics, Inc., Mountain View, Calif.

[21] Appl. No.: 08/716,928

[22] Filed: Sep. 23, 1996

[51] Int. Cl.[6] ................................................. A47B 47/00
[52] U.S. Cl. .................................. 312/265.3; 312/257.1; 312/265.5; 312/223.2
[58] Field of Search ........................ 312/257.1, 265.1, 312/265.2, 265.3, 265.4, 265.5, 265.6, 263, 140, 223.1, 223.2; 211/26, 182, 189, 191; 361/724, 725; 52/653.1, 653.2

[56] References Cited

U.S. PATENT DOCUMENTS

| | | | |
|---|---|---|---|
| 2,598,957 | 6/1952 | Wolfe | 312/265.5 X |
| 3,192,306 | 6/1965 | Skonnord | 312/265.5 X |
| 4,966,424 | 10/1990 | Schneider | 312/263 X |
| 5,020,866 | 6/1991 | McIlwnatih | 312/265.4 |
| 5,048,902 | 9/1991 | Daly | 312/257.1 X |
| 5,235,493 | 8/1993 | Yu | 312/265.5 X |
| 5,269,598 | 12/1993 | Liu | 312/223.2 |
| 5,291,368 | 3/1994 | Conroy-Wass | 361/796 |
| 5,331,508 | 7/1994 | Hosoi et al. | 361/680 |
| 5,339,221 | 8/1994 | Conroy-Wass et al. | 361/796 |
| 5,355,278 | 10/1994 | Hosoi et al. | 361/680 |
| 5,392,192 | 2/1995 | Dunn et al. | 361/683 |
| 5,411,688 | 5/1995 | Morrison et al. | 264/45.4 |
| 5,423,605 | 6/1995 | Liu | 312/265.5 |
| 5,466,058 | 11/1995 | Chen | 312/263 X |
| 5,536,079 | 7/1996 | Kostic | 312/265.5 X |
| 5,542,757 | 8/1996 | Chang | 312/223.2 |
| 5,628,818 | 5/1997 | Smith et al. | 312/223.1 X |

Primary Examiner—Jose V. Chen
Assistant Examiner—James O. Hansen
Attorney, Agent, or Firm—Schwegman, Lundberg, Woessner, and Kluth, P.A.

[57] ABSTRACT

A housing includes a structural frame. The frame has several corner posts. At least two of the corner posts have a recess therein. A resilient sheet is dimensioned to fit between the two corner posts. The resilient sheet includes a first edge and a second edge. Each edge includes a feature shaped so that it engages the recess in the corner post. The engagement of the feature provides a fastenerless attachment of the resilient sheet to the frame. In addition, the resilient sheet includes a curved surface between the first edge and the second edge. When the resilient sheet is positioned between the two posts the curved surface is compressed and acts like a spring which provides another force to hold the resilient sheet in place between the two corner posts.

During manufacture, the resilient sheet can be inserted between the corner posts easily and quickly. The resilient sheet is bent slightly and pushed into place so that the features on the resilient sheet fit the recesses in the frame. The compression force from the curve in the resilient sheet provides a holding force so that the features are not providing the only holding force for the resilient sheet.

23 Claims, 14 Drawing Sheets

RESILIENT PANEL FOR HOUSING A MACHINE

FIELD OF THE INVENTION

The present invention relates to the field of enclosures. More particularly, this invention relates to a portion of the housing for enclosing a large machine.

BACKGROUND OF THE INVENTION

In the past, the outside housings for large machines used fasteners to attach a panel to the frame. The panels that form the housing have predominantly been made of metal. Advantageously, the metal panels provide the needed protection against EMI for some machines such as a computer. In addition, welded and painted metal sheets have also been used since the tooling costs associated with manufacturing machines with metal panels is low. However, use of metal sheets requires many manufacturing steps including forming the sheet metal, making fastener openings in the sheet metal and painting the sheet metal. The metal sheets are fastened with fasteners which uses up manufacturing time and field time for upgrades or repair. Metal sheets are also subject to dents, scratches and scrapes.

More recently, housings have been made of plastic. In a computer system having shielded components, some have been provided with plastic panels for an outside housing. These plastic panels are still attached with separate fasteners and have the advantage of being more resistant to scratches or dents.

Any panel or cover that is attached using fasteners requires extra parts during the manufacturing of the computer. A separate bin of fasteners must be kept on hand and be kept in stock so that the computer housing can be finally assembled. In addition to keeping a bin of fasteners for the final assembly, when using plastic panels other parts must also be kept on hand. The plastic panels attached with fasteners require the installation of a metal boss around the openings in the plastic panel through which the fasteners will pass. Thus, for a plastic panel, even more parts are required to manufacture the computer housing.

In addition to having extra parts, fastening a panel with fasteners, such a small sheet metal screws, requires a fair amount of time. At a minimum, each panel requires at least four such fasteners and more than likely a minimum of eight. Screwing in the fasteners takes time. It also may require specialized machinery such as mechanical screwdrivers but these are generally on a production line already. The mechanical screwdrivers are also faster.

With a formed-sheet plastic panel, additional manufacturing steps for adding bosses to the openings are required. This also adds to the manufacturing process and requires additional parts.

After manufacture, field engineers will generally be called on to either service the machine or upgrade the machine. When fasteners are used to attach machine covers to a housing, the field engineer must remove a number of screws or fasteners to gain access to the parts necessary to fix or upgrade the machine. The screws must also be replaced. This takes valuable field time.

The manufacturing world always has a need for parts and processes that replace multiple parts since this produces a net reduction in the number of parts needed during manufacture. If fasteners can be eliminated, this not only simplifies the manufacturing process but also makes upgrades and servicing a unit in the field much easier. Manufacturers are also looking for ways to make manufacturing lines safer for their workers.

SUMMARY OF THE INVENTION

A housing includes a structural frame. The frame has several corner posts. At least two of the corner posts have a recess therein. A resilient sheet is dimensioned to fit between the two corner posts. The resilient sheet includes a first edge and a second edge. Each edge includes a feature shaped so that it engages the recess in the corner post. The engagement of the feature provides a fastenerless attachment of the resilient sheet to the frame. In addition, the resilient sheet includes a curved surface between the first edge and the second edge. When the resilient sheet is positioned between the two posts the curved surface is compressed and acts like a spring which provides another force to hold the resilient sheet in place between the two corner posts.

During manufacture, the resilient sheet can be inserted between the corner posts easily and quickly. The resilient sheet is bent slightly and pushed into place so that the features on the resilient sheet fit the recesses in the frame. The compression force from the curve in the resilient sheet provides a holding force so that the features are not providing the only holding force for the resilient sheet. The sheet can be attached to the frame of the computer system quickly and can be removed quickly as well. This makes manufacturing simple and straightforward and also helps when field engineers need to service or upgrade the machine. Advantageously, there are less parts required with the resilient sheet since there are no fasteners required to attach the cover to the frame. This saves time in production and also reduces the labor cost associated with building the computer. The plastic also is colored using an integral pigment so a painting operation is eliminated and the integral pigment hides scratches that might occur. In addition, the plastic panel or cover weighs less so can be handled more easily by production workers and field engineers. This also makes the resulting computer much less heavy.

DESCRIPTION OF THE PREFERRED EMBODIMENT

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Each of the figures illustrates an enclosure for a large machine or object. The large machine or object in the figures is a computer. A computer is one example of such a large machine. This specification is not limited to an enclosure for a computer. The computer enclosure is merely an example of such an enclosure. The enclosure could be used for other machines as well.

Figure 1:
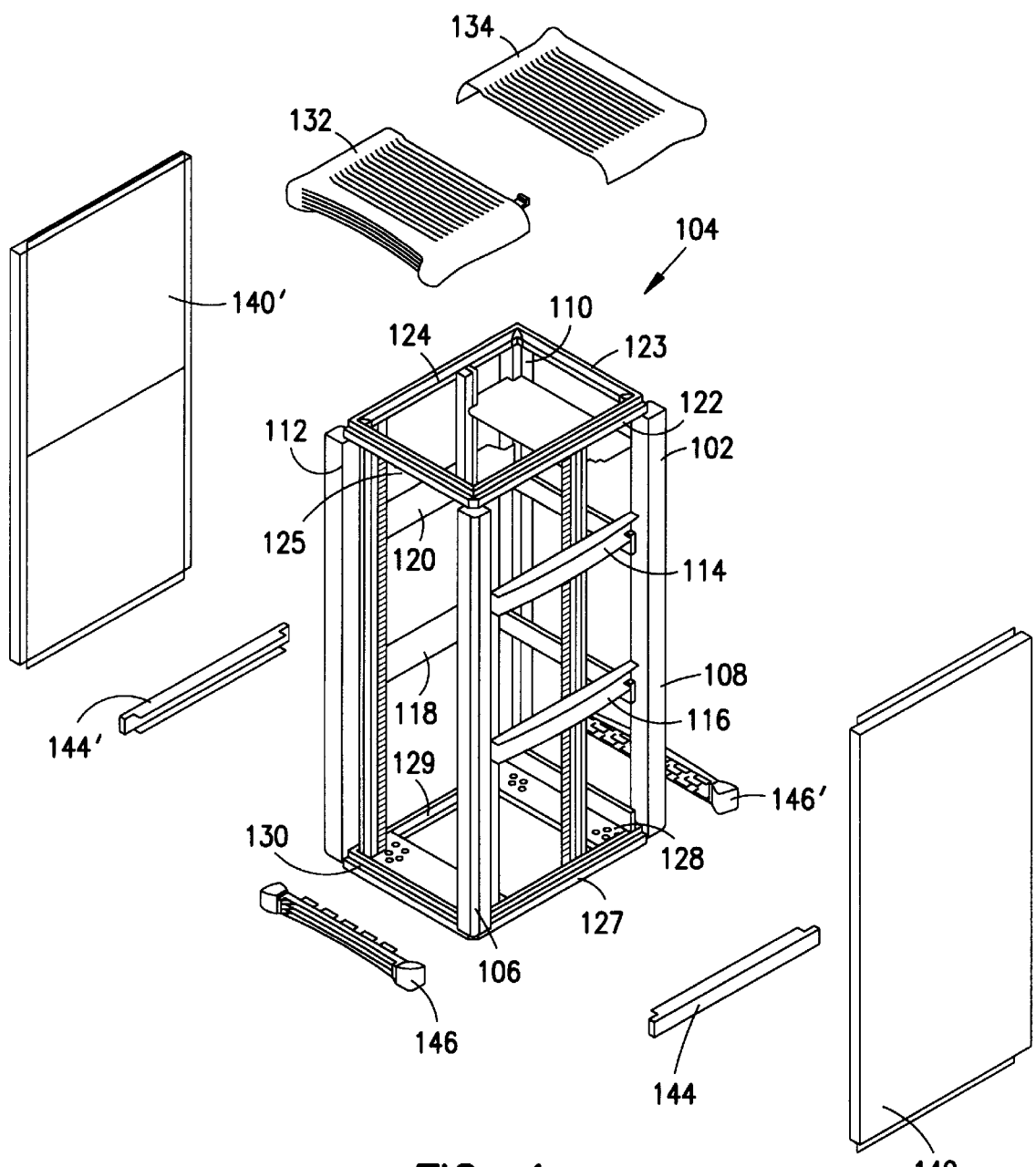
FIG. 1 is an exploded perspective view of the frame for a computer system.

FIG. 1 shows the frame 102 for a basic computer system 104. The frame 102 is comprised of four corner posts 106, 108, 110 and 112. The frame also includes cross members 114, 116, 118 and 120. The frame cross members are interposed between a pair of corner posts. The frame also includes upper cross members 122, 123, 124 and 125. The frame also includes lower frame cross members 127, 128, 129 and 130. A top which comes in two halves 132 and 134 fits on the upper frame members 122, 123, 124 and 125. The top includes louvers which allow air intake to cool the computer system 104. A side panel 140 fits between the corner post 106 and the corner post 108. Similarly, a side panel 140' fits between corner post 110 and corner post 112. Side panel 140 and side panel 140' are essentially identical. A pair of trim pieces 144 and 144' fit over the lower frame member 127 and 129, respectively. Another pair of trim pieces 146 and 146' fit over the lower frame cross member 130 and 128, respectively.

Side Panel Housing Members

Figure 2:
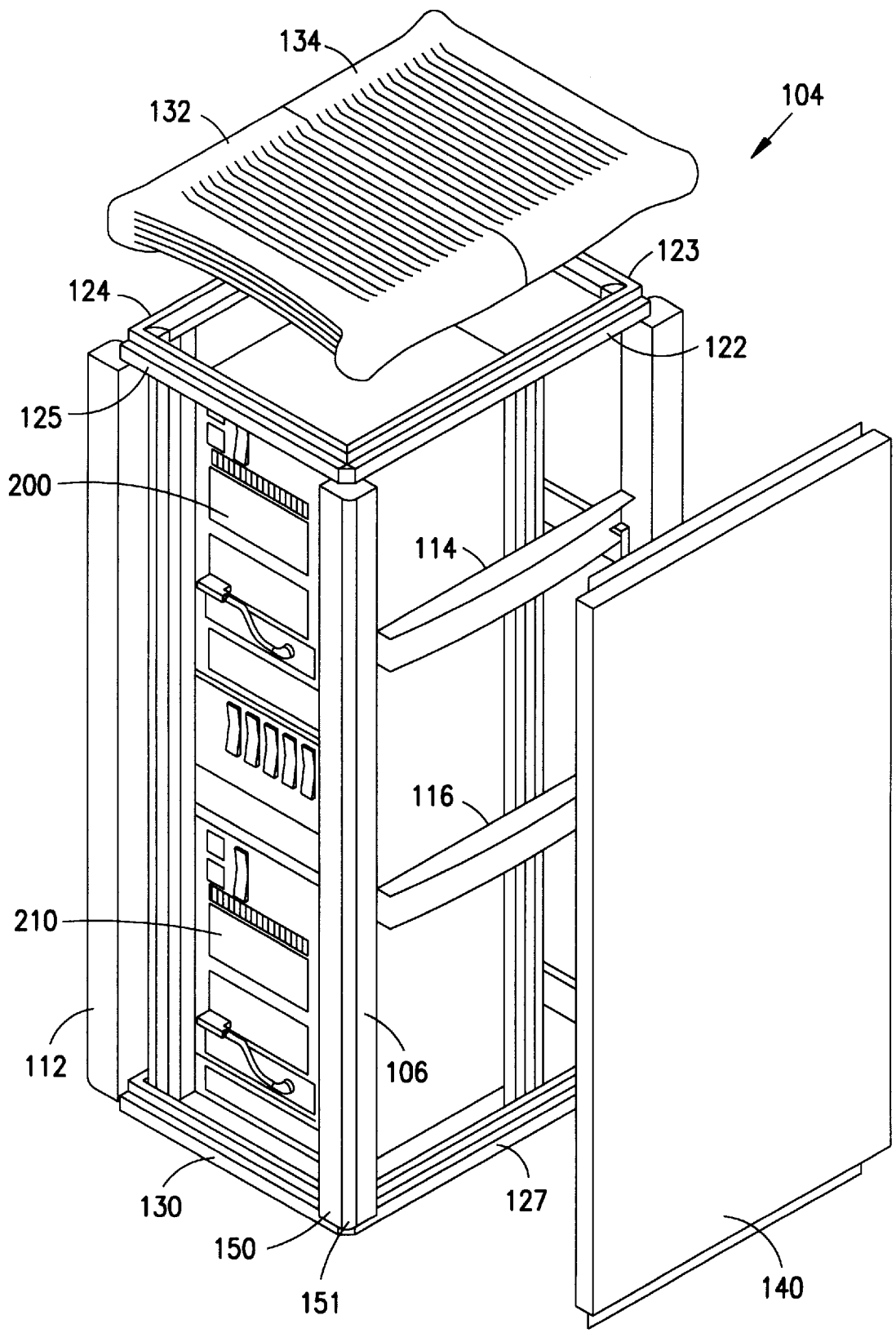
FIG. 2 is an exploded perspective view of the computer system which shows portions of the housing.

FIG. 2 shows the basic computer system 104 which now includes a computing unit 200 and a computing unit 210. In a finally assembled system, the computing unit 200 and computing unit 210 are connected with a pair of computer cables. The computer cables are not shown in FIG. 2. Computing unit 200 and computing unit 210 also have connectors for receiving the ends of the pair of cables. The computing unit 200 is also termed as one computing area and computing unit 210 is also termed a computing area.

Figure 3:
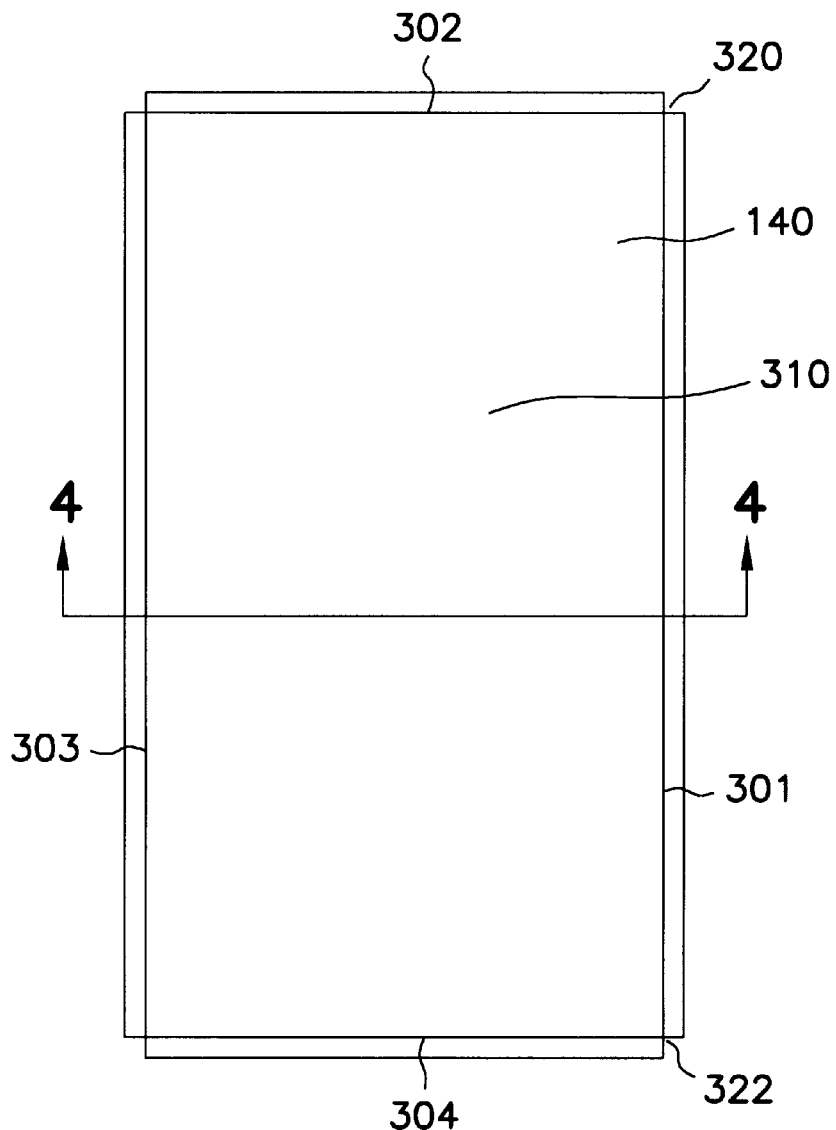
FIG. 3 is side view of one side panel of the housing of the computer system shown in FIG. 2.

Side panel 140 and its interconnection with frame corner posts 106 and 108 will now be discussed. FIG. 3 shows a top view of the panel 140. Panel 140 further comprises edges 301, 302, 303 and 304. The edges bound a main body portion 310 of the side panel 140. The corners of the panel 140 are relieved or have cutouts therein, such as corner 320 and 322. The reliefs allow the side wall to act like a small independent spring and allows the main body portion to behave as an independent giant elastic spring structure. The reliefs at the corners allow the side wall to act independently of the main body portion 310.

Figure 4:
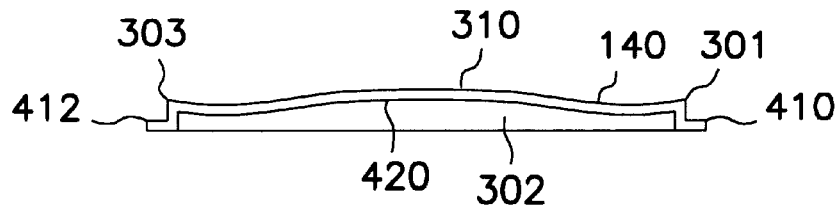
FIG. 4 is cross-sectional view of the side panel of the housing of the computer system along cut line 4—4 of FIG. 3.

FIG. 4 shows the side panel 140 in cross section as taken along cut line 44 from FIG. 3. As can be seen from this cross-sectional view, the main body 310 of the side panel 140 includes a curved surface 400. The curved surface 400 of the side panel 140 allows the side panel 140 to act as a spring when a compressive force is placed upon the edges of the side panel 301 and 303. In other words, when a compressive load is placed on the edges 301 and 303, the curved surface 400 can become slightly more curved and produce a force which is proportional to the amount of compression in the spring or curved surface 400. The main body 310 of the side panel 140 is made up of a resilient material such as formed ABS plastic. Each edge 301 and 303 includes a feature 410 and 412, respectively. In a preferred embodiment shown in FIG. 4, the edge 301 and feature 410 form an L, shape. Similarly, edge 303 and feature 412 also form an L shape. In this particular embodiment, the features 410 and 412 are essentially flanges that run along the length of the respective edge of the side panel 140. Attached to the back of the panel 140 and between the edges 301 and 303 is a urethane foam sheet 420. The urethane foam 420 provides the side panel 140 with a more solid feel when bumped or tapped. The side panel is flexible when not positioned between a pair of corner posts. The side panel gains rigidity when installed between the corner posts.

Figure 5:
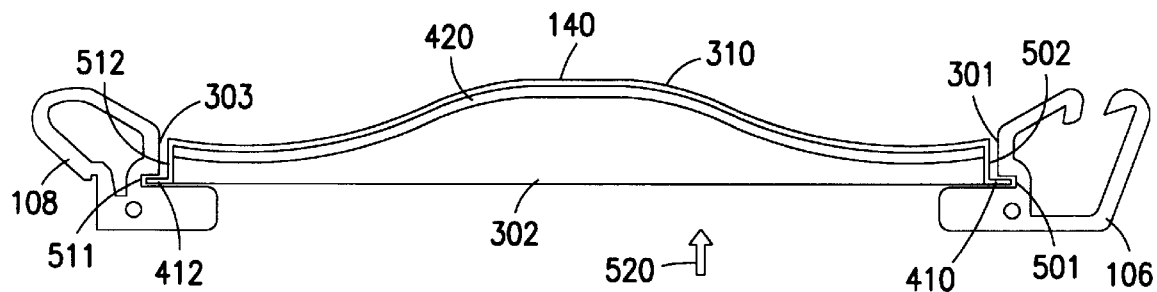
FIG. 5 is a cross-sectional view of the side panel of the housing engaged with a pair of corner posts of the computer system.

FIG. 5 shows a side panel 140 installed between the corner post 106 and the corner post 108. The corner post 106 includes a recess 501 which runs along a length of the corner post in this particular embodiment of the invention. The corner post 106 also has an abutment surface 502. Similarly, corner post 108 includes a recess 511 and an abutment surface 512. Of course, in FIG. 5, the side panel 140 is shown engaged with the corner posts 106 and 108. As engaged, the feature 410 fits within the recess 501 and the edge 301 abuts against the abutment surface 502. Similarly, for post 108, the feature 412 fits within the recess 511 and the edge 303 abuts against abutment surface 512. It should be noted at this juncture that the recess, such as 501, is shaped to receive the feature 410 and that the recess 511 is shaped to receive the feature 412. The features 410 and 412 are flanges along the edges of the side panel 140.

Figure 6:
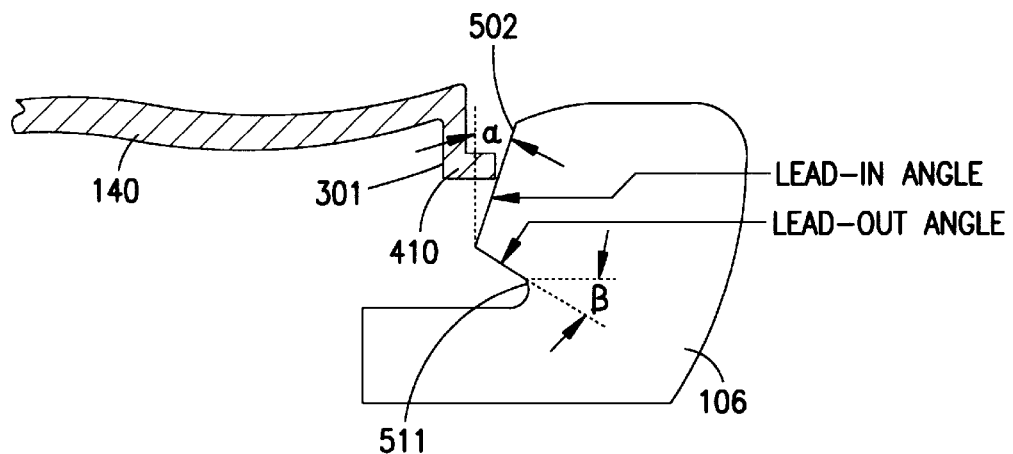
FIG. 6 is a cross-sectional top view of a corner post of the computer system.

FIG. 6 shows a top cross-sectional view of the corner post 106. The cross-sectional view of FIG. 6 includes a lead-in angle $\alpha$ associated with the abutment surface 502 and a lead-out angle $\beta$ associated with the recess 511. The angles in this cross section have been exaggerated to make a point. The lead-in angle $\alpha$ allows the edge 301 of the side panel 140 to fit between the posts 106 and 108. As the side panel 140 is further inserted between the posts, the feature 410 travels down the incline and progressively deflects edge 301 inwardly while it travels to the recess 511. The lead-in angle $\alpha$ provides for an easier installation of the side panel 140 between the posts 106 and 108.

FIG. 6 also shows an exaggerated lead-out angle $\beta$. The lead-out angle makes removal of the panel 140 easier since feature 410 rides over the inclined surface of the recess 511 during the removal process. Both angle $\alpha$ and angle $\beta$ must be steep enough to allow easy movement of the panel but must not be too steep so as to inhibit movement of the side panel 140. The angle $\alpha$ is in the range of 5°–30°. The angle $\beta$ is in the range of 20°–50°.

The features do not necessarily have to be flanges but could be any shape and still be within the scope of the invention. For example, the features 410 and 412 could be rounded at the ends or include a diamond-shaped end or even a square end. These are just a few examples of what could be used as features. It should also be noted that the feature as shown in FIG. 5 is shown at one end of the abutment surface 502, 512. The feature could occur in the middle of the edge 301 or 303 and the recess which mates with the feature or accommodates the feature could occur midway along the abutment surface 502, 512. Thus, the feature and the recess are not limited to a flange occurring at one end of the edge. The important thing is that the feature 410 or 412 aligns positionally with a recess on the post 106 or 108.

When the side panel 140 is installed between the posts 106 and 108, the edges 301 and 303 abut or contact the abutment surfaces 502 and 512, respectively. The curved surface of the main body portion 310 acts like a spring in that upon installation, it becomes somewhat compressed. By compressing the main body portion of the side panel 140, it is like compressing a spring in that by compressing it, a force is produced at the ends of the spring or at the edges 301 and 303 of the side panel 140. As a result, edge 301 not only touches abutment surface 502 on post 106, but there is a force applied by the curve in the main body 310 of the side panel which forces the edge 301 toward the abutment surface 502. Similarly, edge 303 is forced into the abutment surface 512 of post 108 by the spring force produced by the curve and the main body portion 310 of the side panel 140. This produces an advantage in that the features 410 and 412 of the edges 301 and 303, respectively, are not taking the total load of the side panel and holding it into place. Thus, the features 410 and 412 do not have to be as large and the edges 301 and 303 are taking on a portion of the load and a compressive force is placed on the posts 106 and 108 to hold the main body panel in position. The flanges or features 410 and 412 housed within their respective recesses 501 and 511 do not have to produce substantially all or the entire force which holds the body panel in place. Thus, the force necessary to hold the side panel 140 in place is spread over the edges and the abutment surfaces 502, 512 as well as into the recesses 501 and 511. The feature, such as 410 and 412, does not have to provide substantially all or the entire force which holds the side panel 140 onto the computer system. The strain on the features 410 and 412 is, therefore, minimized. Advantageously, the features 410 and 412 counteract a separating force which is depicted by arrow 520 in FIG. 5. The separating force tends to move the features out of their respective recesses and away from the posts 106 and 108 of the computer housing.

In the preferred embodiment shown in FIGS. 2–5, the side panel 140 is made of ABS plastic which is vacuum formed. After vacuum forming the side panel from the parent sheet, the remnants are typically trimmed. In this particular embodiment shown in FIGS. 2–5, the features 410 and 412 along the edges 301 and 303, as well as the other edges, are not trimmed all the way off and this gives rise to the particular features or a flange. Making the side panels 140 out of a plastic also provides a lightweight side panel for the computer housing. The urethane foam backing 420 gives the side panel 140 a more solid feel and a more solid sound if and when the side panel 140 is bumped or knocked. The plastic side panel 140 also has integral pigment and texture which can be provided by a collated thin film applied to the sheet prior to vacuum forming. The plastic side panel 140 can also be provided with an integral metal layer or metal fiber to help prevent problems with electromagnetic interference ("EMI"). The urethane foam backing can also have conductive characteristics to aid with EMI protection. A further advantage of the plastic sheet is that installation is very easy and intuitive. The plastic sheet is merely popped in between the frame members 106 and 108. More specifically, the side panel 140 is positioned between the posts 106 and 108 so that the features 410 and 412 are engaged with the abutment surfaces 502 and 512. One edge is merely pushed in until the particular feature associated with that edge, such as 501, engages the recess in the post 106. The same is done on the opposite side with feature 412 engaging recess 511. Once the feature 410 is engaged with the side abutment surface 502 of post 106 and the feature 412 is engaged with the abutment surface 512 of post 108, the panel can merely be pressed into place until the features engage their respective recesses. The plastic panel is also very easy to take out, since neither feature 410 or the feature 412 is excessively long and since there is a lead-out angle. The panel can be bent slightly to relieve some of the force and then merely peeled off of the housing. It should be noted that once the panel is installed it gains rigidity provided by the frame. Cross frame members 114 and 116 have a curved form which conforms to back side of the panel to add rigidity and the foam backing absorbs tolerance differences. The ease of installing and taking out the panel provides for ease of manufacture as well as ease in upgrading the computer system. Upgrading a scalable computer usually includes adding computing units within additional frames. For example, the computer system shown in FIG. 2 can be upgraded to the computer system shown in FIG. 9 by adding three additional frames containing a total of 6 additional computing units. The plastic panel 140 allows for easy upgrades to the housing of the computer system. To upgrade a computer system, the panel 140 is merely removed and set aside. Another frame is positioned adjacent the initial frame which has frame members similar to those from which the panel was removed. The old panel is then reinstalled on the outside of the housing.

Figure 7:
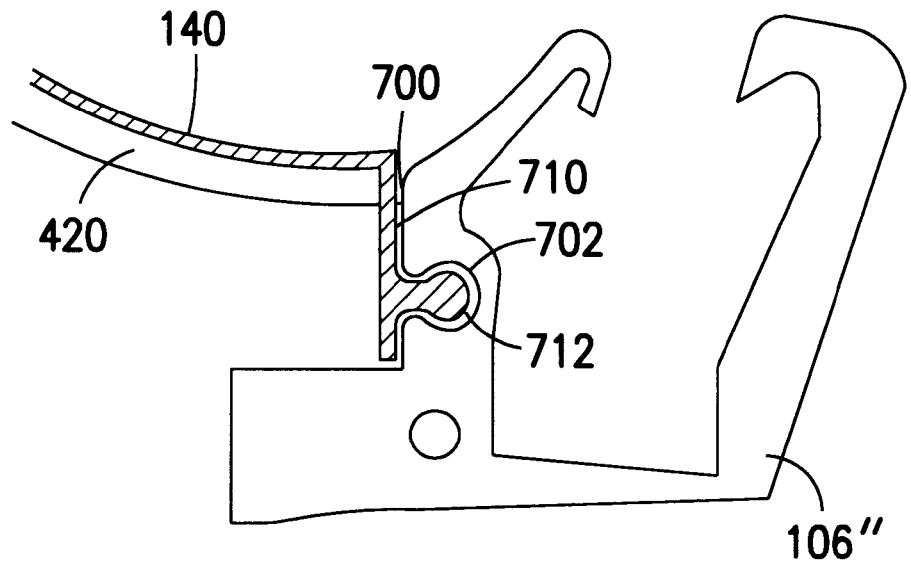
FIG. 7 is a cross-sectional view of another preferred embodiment of a side panel of the housing engaged with a corner post of the computer system.
Figure 8:
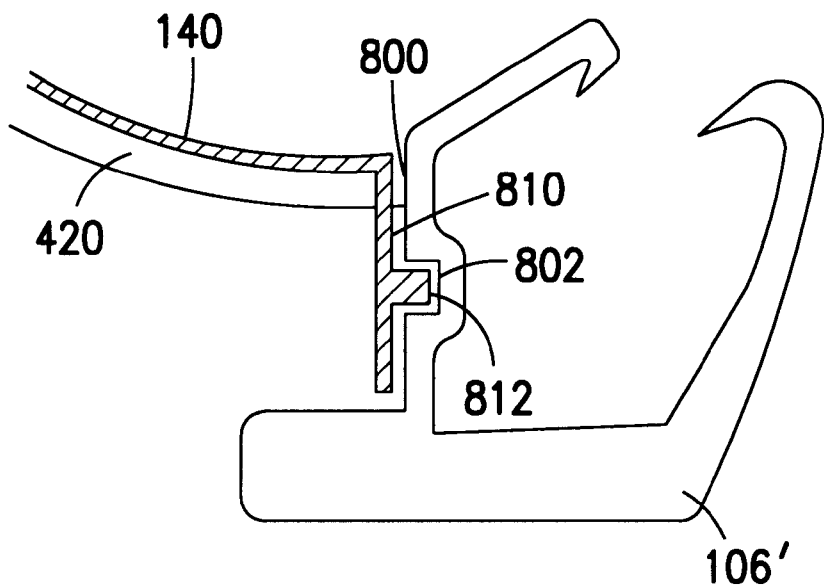
FIG. 8 is a cross-sectional view of another preferred embodiment of a side panel of the housing engaged with a corner post of the computer system.

The flange allows a spring finger of maximum length and practical use of vacuum forming process. However, the features do not necessarily have to be a flange as is shown in FIGS. 2–5. This is illustrated by FIGS. 7 and 8. FIGS. 7 and 8 feature posts 106' and 106". Corner posts 106' and 106" each include a recess that has a different shape and is located at a different position along the abutment wall or abutment surface. Now turning to FIG. 7, the corner post 106" includes an abutment surface 700 with a recess 702. The side panel 140 has an edge 710 which includes a feature 712 which fits into the recess 702. Now looking specifically at FIG. 8, the abutment wall 800 includes a recess 802 which occurs about midway between the ends of the abutment surface 800. The side panel 140 includes an edge 810 which has a square feature 812 which engages the recess 802 of the post 106'. Of import here is that the feature has a shape that corresponds to the shape of the recess and is located at approximately the same distance on the edge of the body panel so that it corresponds with the recess opening.

Cable Management

Figure 9:
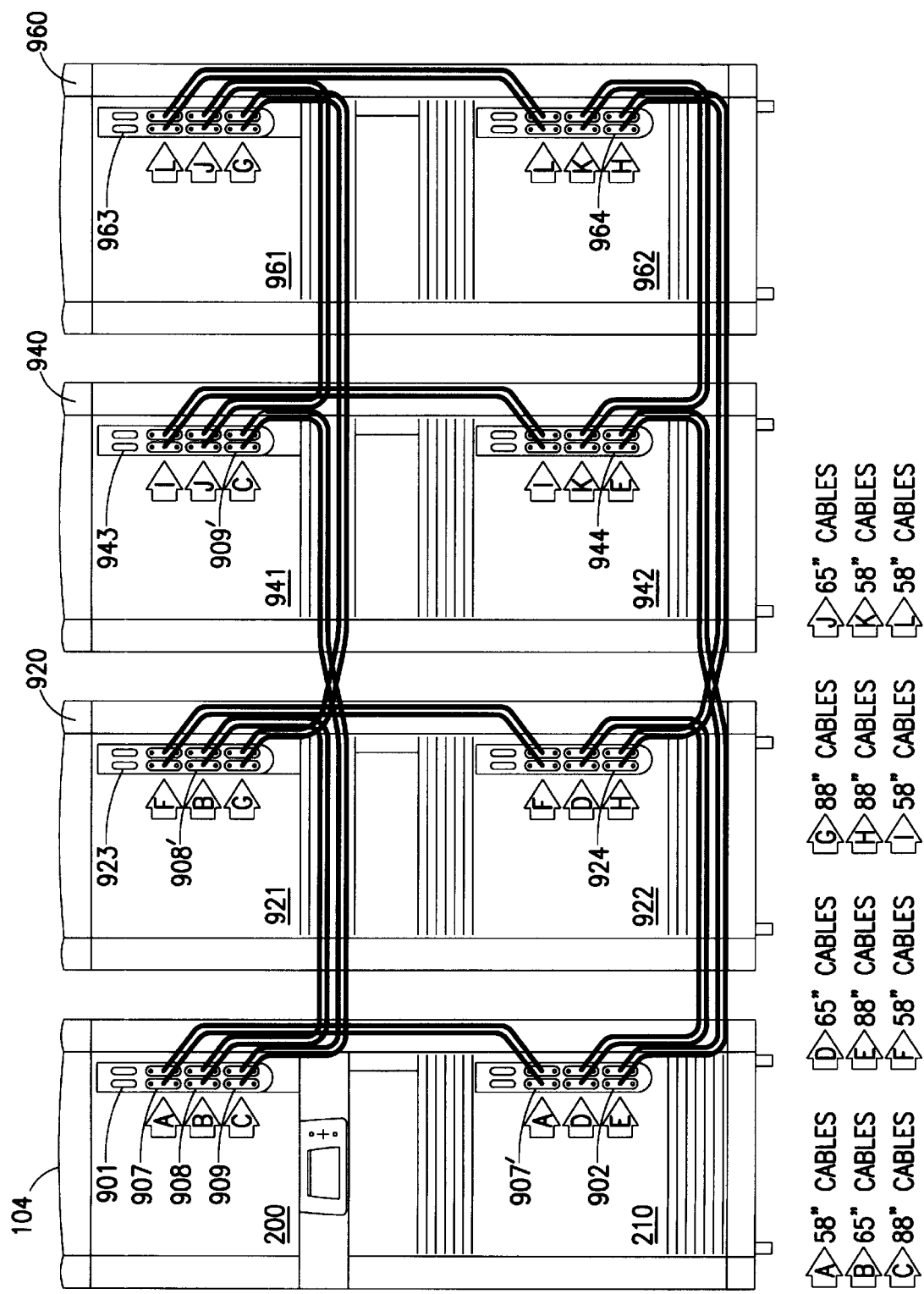
FIG. 9 is a scaled up computer system having a plurality of frames and shows the cable routing.

FIG. 9 shows a computer system that has been scaled up or expanded from the computer system shown in FIG. 2. The original computer system 104 is shown in FIG. 9. Computer system 104 includes computing unit 200 and computing unit 210. Computing unit 200 includes a set of connectors 901 and computing unit 210 has a set of connectors 902. The computer system 104 also includes a control panel 904 which includes a display 905. Computing system 104 can be thought of as having two computer areas or two computing areas which correspond to the areas occupied by computing unit 200 and computing unit 210. As the computer system is grown or is scaled upward, a new frame with one or more computing units is added to the original system 104. In FIG. 9, three new frames 920, 940 and 960 have been added to the original system. Each of the new frames includes two new computing units. Frame 920 now houses computing unit 921 and 922. Frame 940 includes computing area 941 and 942, and frame 960 includes computing unit 961 and 962. Each of the computing units includes a set of connectors. Computing unit 921 includes the set of connectors 923. Computing unit 922 includes connectors 924; computing unit 941 includes connectors 943; computing unit 942 includes connectors 944; computing unit 961 includes connectors 963; and computing unit 962 includes connectors 964. When the original computer system is scaled up or grown, it is necessary to make cable connections between the various computing areas or the various computing units. The cable connections are necessary to carry information including links to parallel processors between the various computing units. In this particular system, the computing units are input/output intensive. Roughly translated, this means that there are many cables emanating from the back side of the computer system and from each and every one of the separate computing areas. Such a system might be for use as a video server and provide videos to a number of subscribers or such a system might be a server connected to a large number of disk drives.

Since there is a potential to have so many cables emerging from the back of the computer system, the cables necessary to attach various computing units, such as 200, 210, 921, 922, 941, 942, 961 and 962, have been placed in the front of the computer to eliminate or lessen the congestion that occurs in the back of the computer due to the I/O-intensive nature of the computer system. As can be seen from FIG. 9, sometimes the cables have to make purely vertical runs such as the cables emanating from port 907 of computing unit 200 and going to port 907' of computing unit 210. Other cables have to be routed both vertically as well as horizontally, such as cables emanating from port 908 of computing unit 200 and traveling to port 908' of computing unit 921. This cable starts at 908 travels vertically down and then passes across from one frame to another, from the frame associated with the computer system 104 to the frame 920 and to the computing unit 921. Other cables such as those emanating from port 909 and terminating at 909' travel long horizontal distances across several frames such as 920 and 940 and also have a short vertical drop and a short vertical rise along its path.

The cables used to connect between various computing areas are approximately three-quarters of an inch thick and are shielded and have a minimum bending radius specified. The various cables cannot be bent with a smaller radius than the minimum bending radius. In order to pass the cables on the front of the computer as well as to live within the specifications of the bending radius, this computer has a cable management system. The cable management system is comprised of various combinations of three components which will be described in the paragraphs that follow. A post having a hollow core is used for vertical cable runs of all sorts. For horizontal cable runs, a comb is used and to convert a vertical cable run to a cable connection to a particular computing unit, a cable guide or bale is used. These will now be discussed in further detail.

Figure 10:
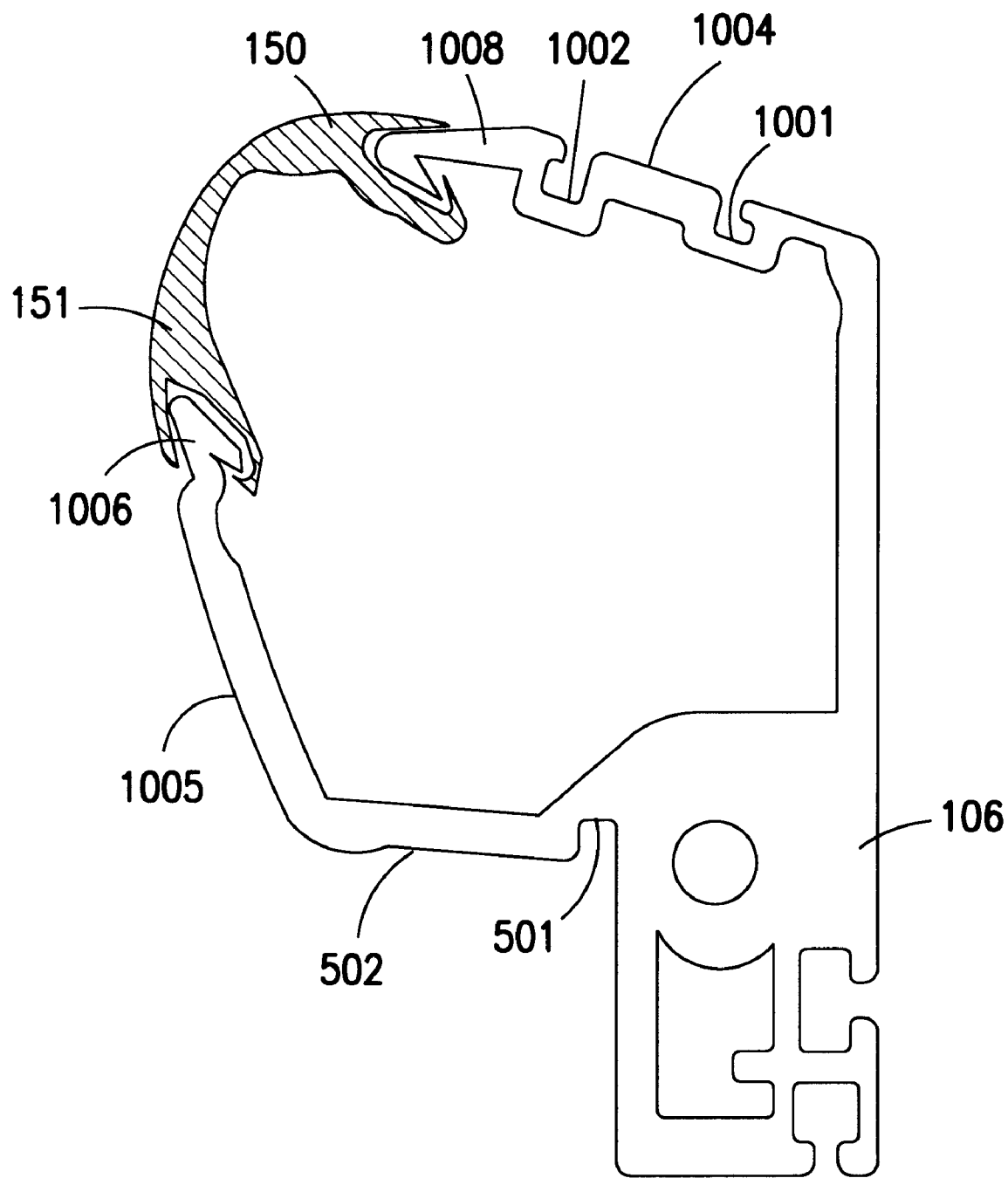
FIG. 10 is a cross-sectional view of the corner post of the computer system.

As can be seen in FIGS. 1 and 2, corner post 106 differs from the other corner posts 108, 110 and 112. As best shown in FIG. 2, the corner post 106 includes two flaps 150 and 151. The flaps 150 and 151 cover a slot within the corner post. This is best seen by turning to a cross-sectional view of the corner post shown in FIG. 10. Corner post 106 is C shaped in cross section. The C shape has several flattened sides including the abutment surface 502 and a surface having channel 1001 and another channel 1002. The external surface near the channels 1001 and 1002 is substantially planar. The substantially planar surface is labeled with the reference numeral 1004. The abutment surface 502 is adjoined to another slightly curved member 1005. Curved member 1005 has a free end 1006 which corresponds to the free end of a C. Free end 1006 includes a retaining member which is shown in FIG. 10 to be a barb. Member 1008 includes the channels 1001 and 1002 as well as the flat surface 1004. Member 1008 has a free end 1009 which is used to retain flap 150. In this particular embodiment, the end retainer is shaped like a barb. The flaps 150 and 151 include a first material for connecting to the flapretaining surface 1009 and a second softer material which forms the remainder of the flap. Flap 151 is similarly constructed. Flaps 150 and 151 as attached to their respective barbs meet and form a curtain that covers the open slot in the cross-sectional area of the post 106. In operation, the hollow portion of the post 106 is used as a cable run or cable conduit. The flaps allow the cable to enter or exit and the flaps 150, 151 conform to the cable as it is going into or coming out of the cable run or cable conduit. It should be noted that each frame such as 920, 940 and 960 includes a similar corner post which is used as a vertical cable run.

Figure 11:
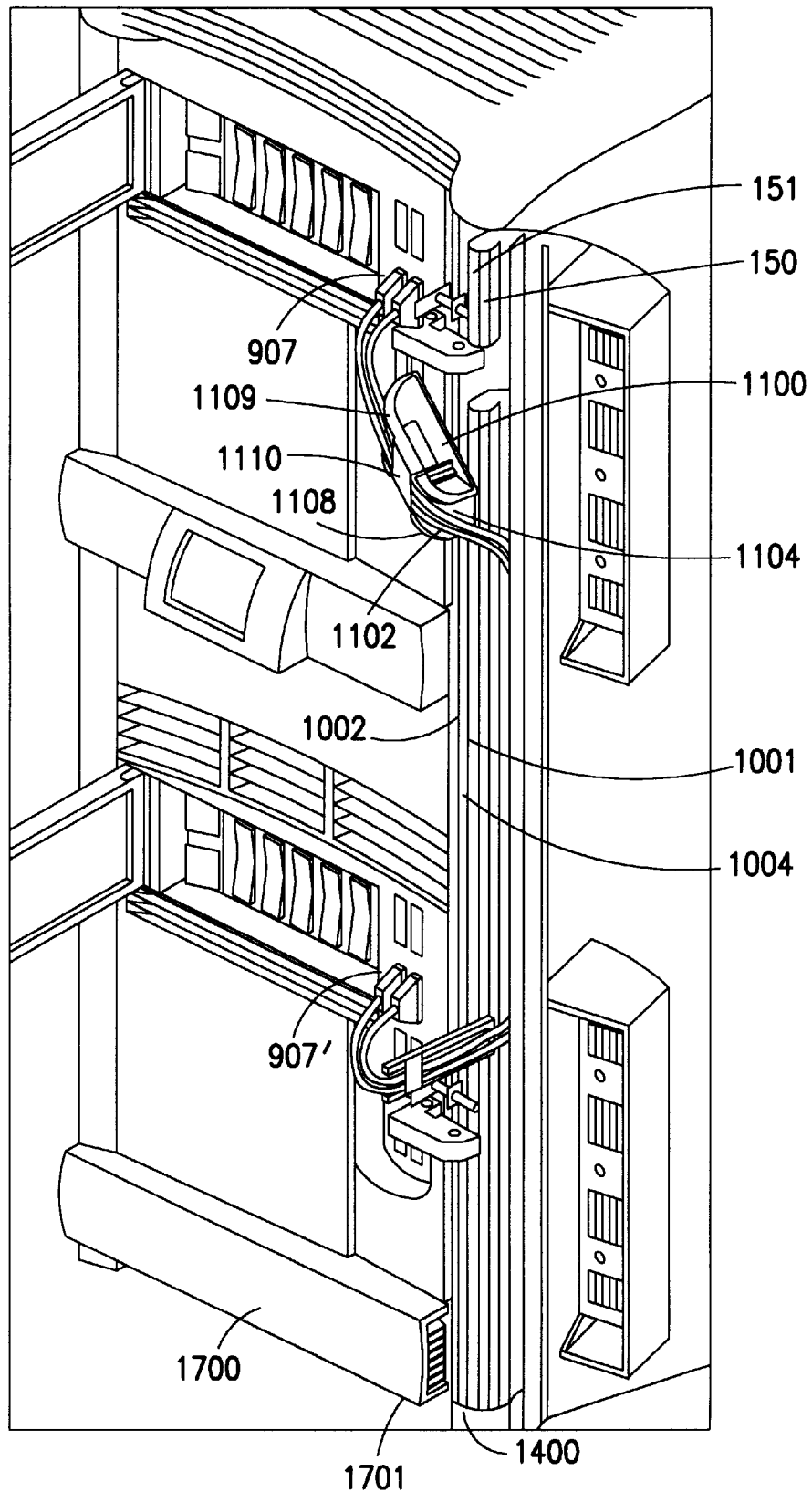
FIG. 11 is a partial perspective view of the cables, cable guide and corner post of one frame of the computer system.

The flaps 150 and 151 are made of a two dual hardness co-extruded thermoplastic elastomer strips. The harder plastic that fits over the barb 109 allows for zipperlock fastening of the flaps to each of the barbs. The flaps 150 and 151 cover the opening in the C-shaped cross section of the corner post 106. When a cable is leaving or entering the frame conduit or cable run, which is the hollow portion of the corner post 106, the flaps also support the cables as they leave or enter the corner post 106. FIG. 11 shows two cables as they are leaving the corner post 106. Flaps 150 and 151 are also shown in FIG. 11.

FIG. 11 also shows a cable guide 1100 as it is used in the cable management system. In FIG. 11 a pair of cables 1102 emerge from between the flaps 150 and 151 and pass over a rounded surface 1104 of the cable guide 1100. The cable guide 1100 is positioned so that as the cables leave the cable guide, they are near their termination point which in this case, is port 907 of the computing unit. The cable guide includes a pair of lips 1108 and 1109. The lips act to retain the cable on the cable guide. A clip 1110 also fits over the lips and this also retains the cable or pair of cables 1102 to the cable guide. The clip 1110 is at a height that is above the lips 1108 and 1109. Thus, the lips 1108 and 1109 serve as a standoff for the clip 1100. FIG. 11 also shows another cable guide 1150 which guides the cables form the cable run or hollow portion of the corner post 107 down to a port 907' of a lower computing unit.

Figure 12:
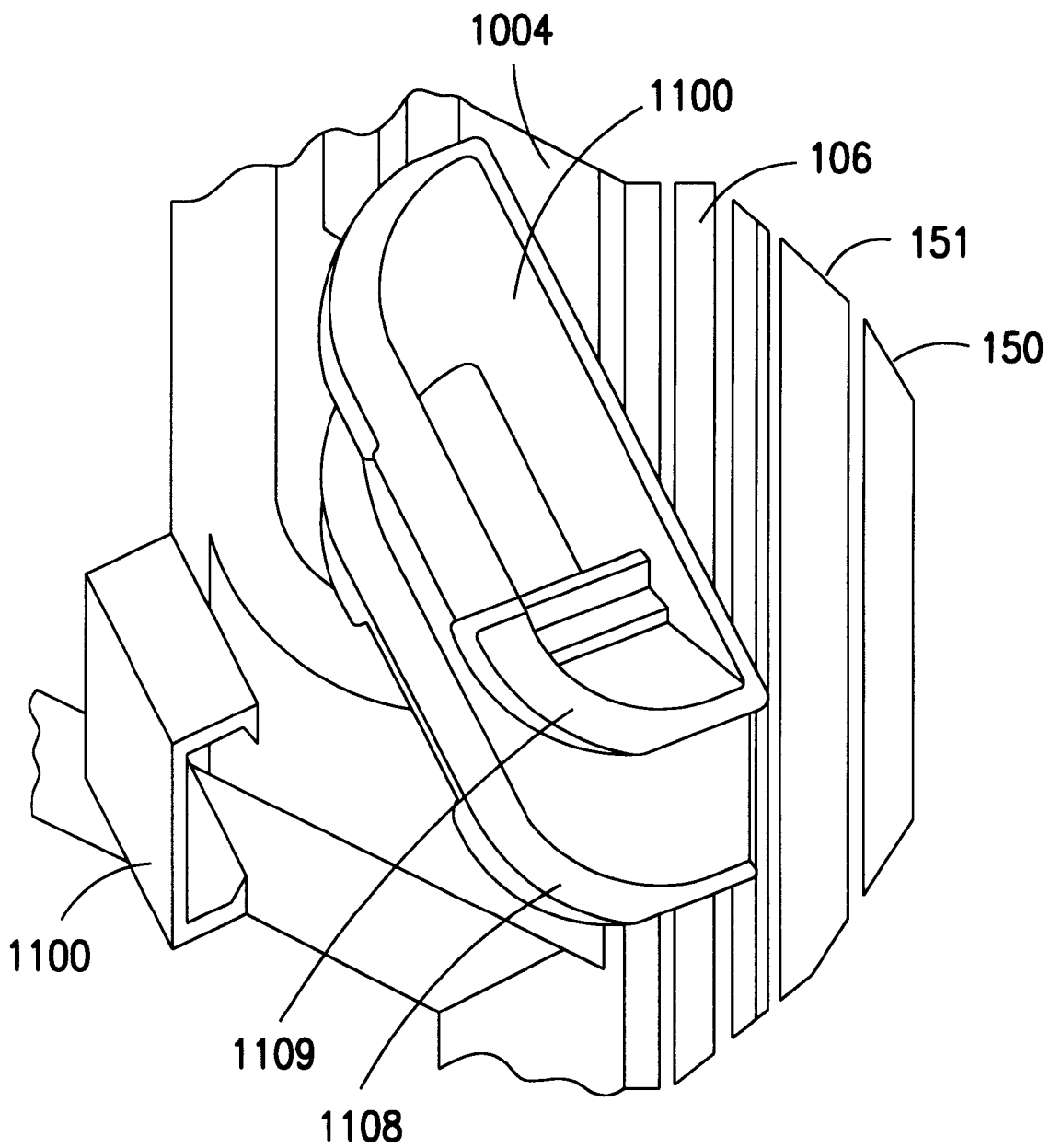
FIG. 12 is a perspective view of the cable guide attached to the corner post of one frame of the computer system.

Now turning to FIG. 12, we can see that the cable guide 1100 is attached to the corner post 106. The cable guide is attached to the corner post at the channels 1001, 1004 (shown in FIG. 11 and shown FIG. 10).

Figure 13:
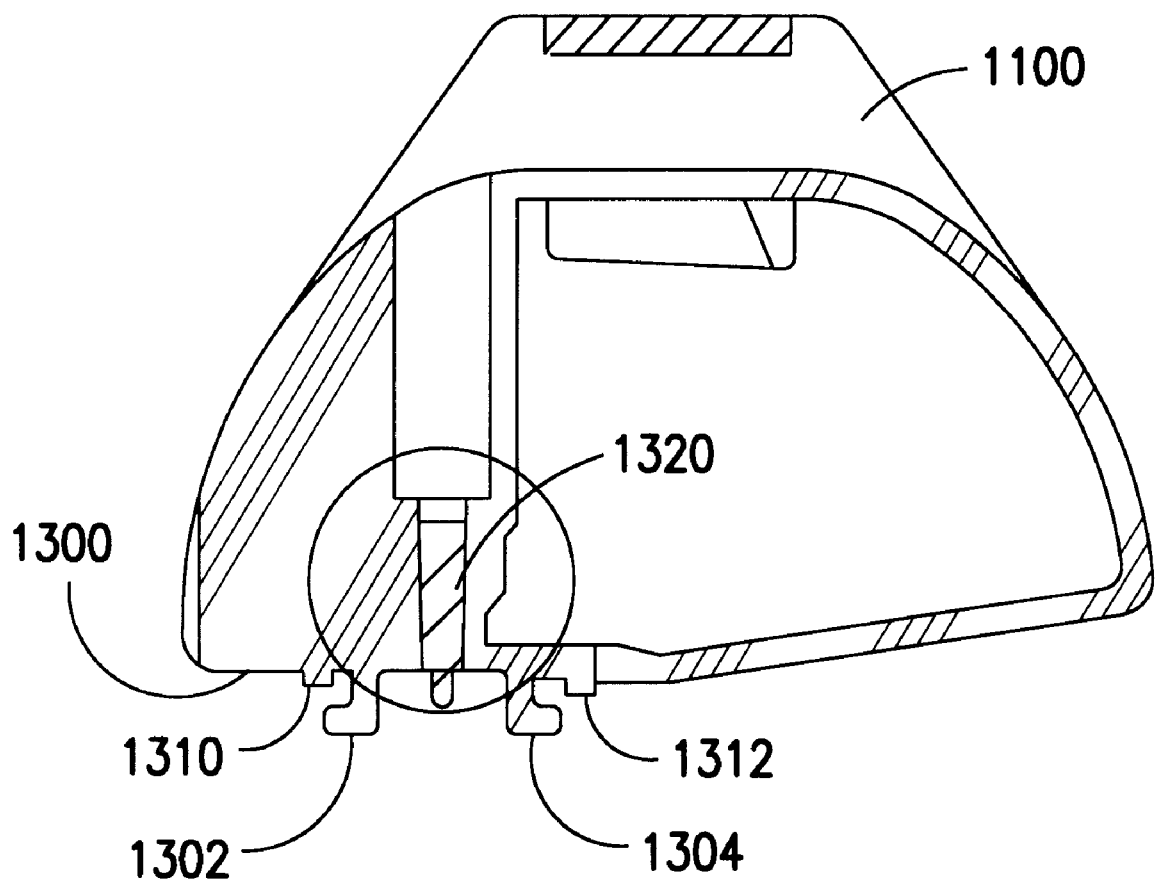
FIG. 13 is a cross-sectional view of the cable guide.

FIG. 13 shows a cross-sectional view of the cable guide 1100. The cable guide 1100 includes a surface 1300 which also includes a pair of square knobs 1310 and 1312 which engage surface 1004 of the corner post 106. As shown in the cross section, cable guide 1100 includes a first L-shaped leg 1302 or retaining means and a second L-shaped leg 1304 or retaining means. The L-shaped leg or retaining means 1302 engages the channel 1002 as shown in FIG. 10 while the L-shaped leg or retaining means 1304 engages the channel 1001 as shown in FIG. 10. The L-shaped retaining legs 1302 and 1304 are not the only design that would work to hold the cable guide 1100 to the corner post 106. Other means are also available and other shapes of channels and retaining legs are also contemplated as being within the scope of this invention. The cable guide 1100 also includes a mechanism for engaging a detente on the post or corner post 106. Detentes or small, shallow, hemispherical pockets are placed in the corner post 106 so that the cable guides may be positioned so that one end of the cable guide aligns near the port to which the cables are either coming from or going to, or to which it is connected. The cable guide includes a ball-plunger mechanism 1320 which engages the detentes on the corner post 1106. To install a cable guide, there is typically provided a relief in the corner post 106 at a level that is beyond the detentes in the corner post. In other words, there is a small opening or recess in the channel of sufficient length so that the retaining legs 1302 and 1304 of the cable guide can pass into the channel at that point. By inserting the legs 1302 and 1304 into the channel and then moving the cable guide 1100 away from the recess or opening, the retaining legs engage the channel walls.

The cable guide 1100 has a rounded shape that is actually helical. Advantageously, the cable guide is able to change directions of the cable from vertical to horizontal and also change the direction of the cable from coming out of the corner post to going into the port to which it is connected. The helical shape of the cable guide prevents the cable from bending in a vertical direction at a radius which is less than the minimum radius. The cable guide is also dimensioned so that the change of the cable from coming out of the corner post and going into the port is also greater than the required radius specified by the cable manufacturer. It should be pointed out that the minimum radius specified by the cable manufacturer is quite critical since going beyond the minimum radius or at a smaller radius may compromise the insulation on the cable. It should be noted that these cables are substantial. Each cable is three-quarters of an inch thick and has a sheathing to prevent electromagnetic interference. These cables are also carrying massive amounts of information at a rate of approximately 800 megabytes per second, so it is critical that the insulation not be compromised because to do so could also compromise the integrity of the whole computer system.

Figure 14:
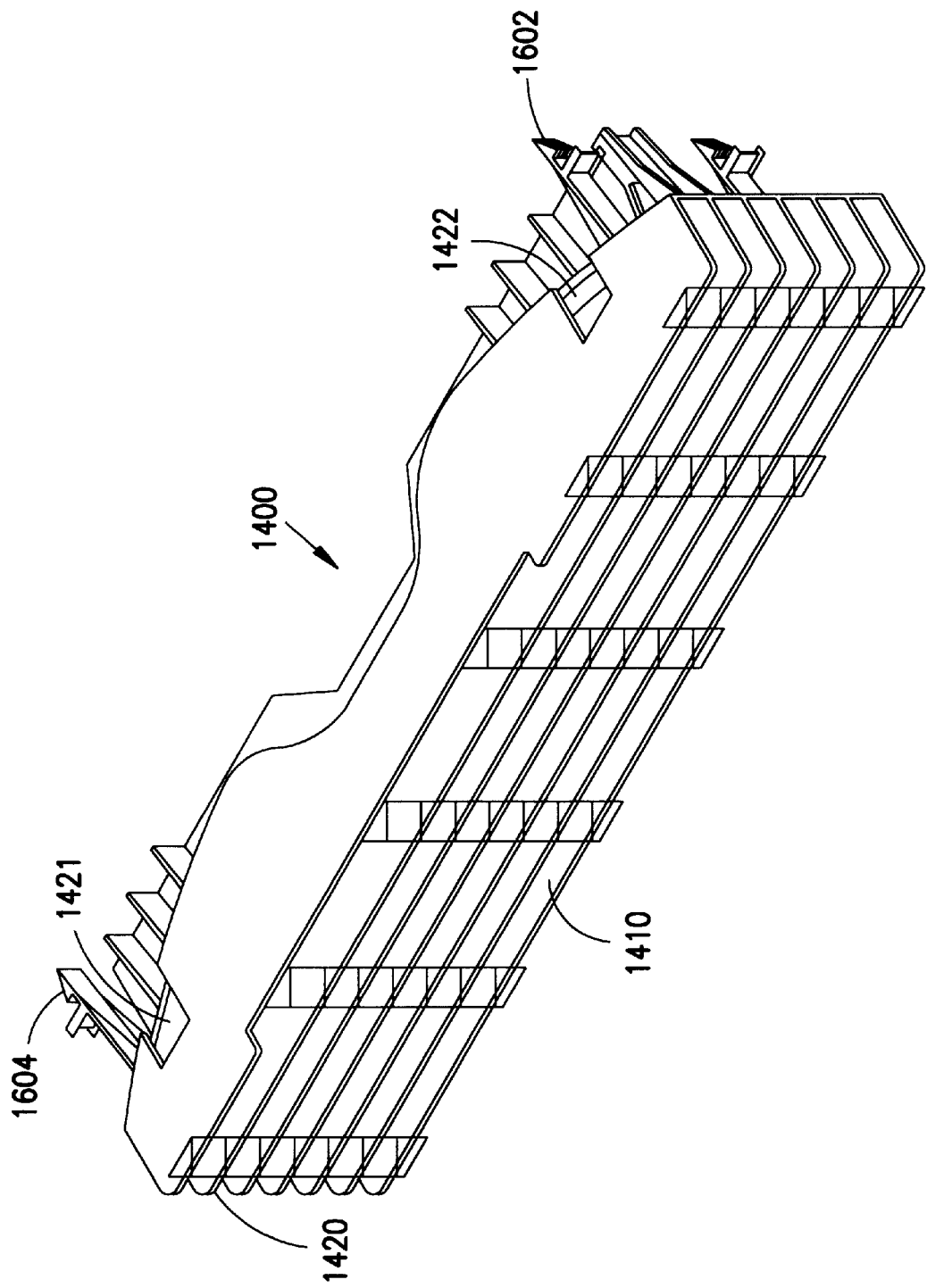
FIG. 14 is a perspective view of the cable comb of the computer system.
Figure 15:
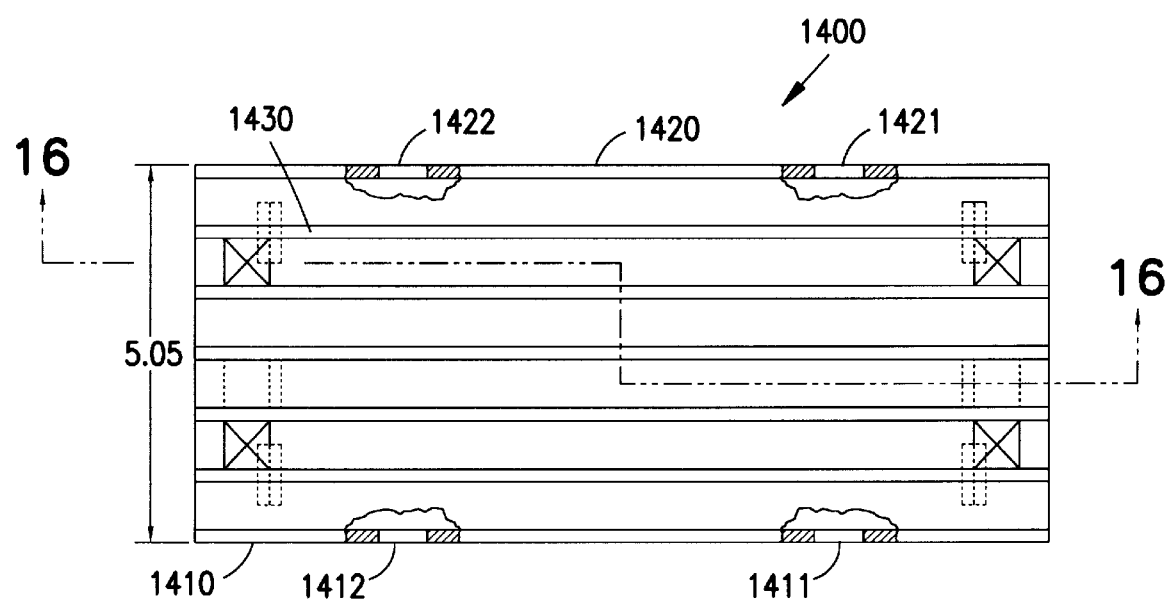
FIG. 15 is a front view of the cable comb of the computer system.
Figure 16:
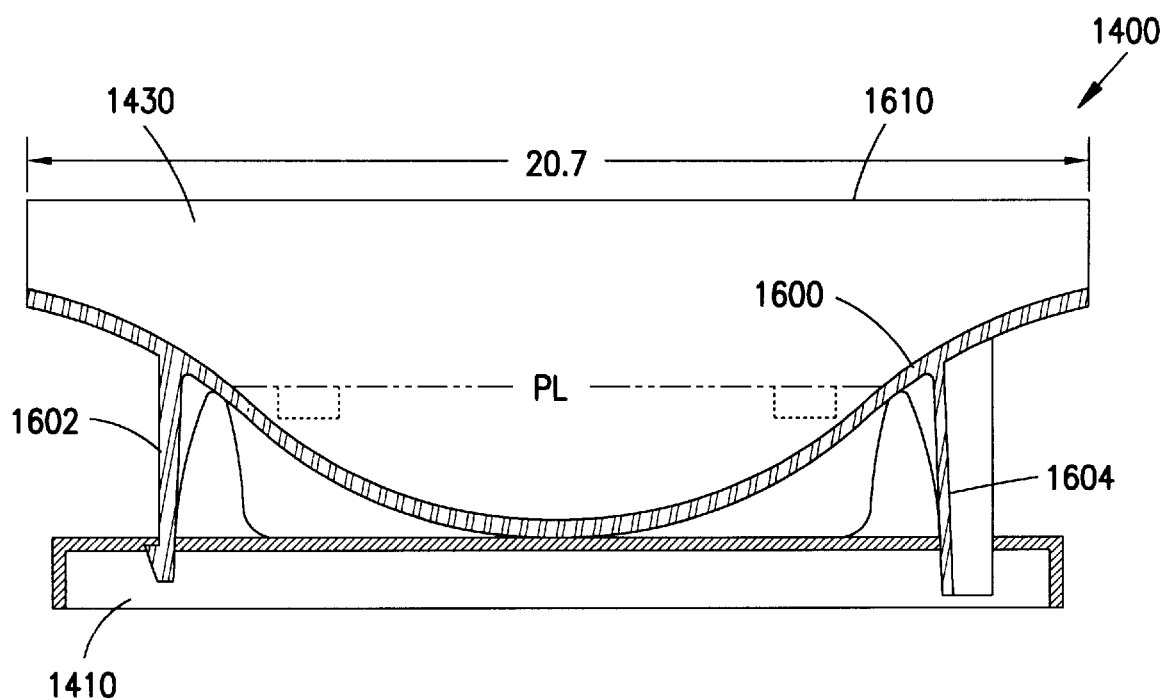
FIG. 16 is a cross-sectional view of the cable comb of the computer system.
Figure 17:
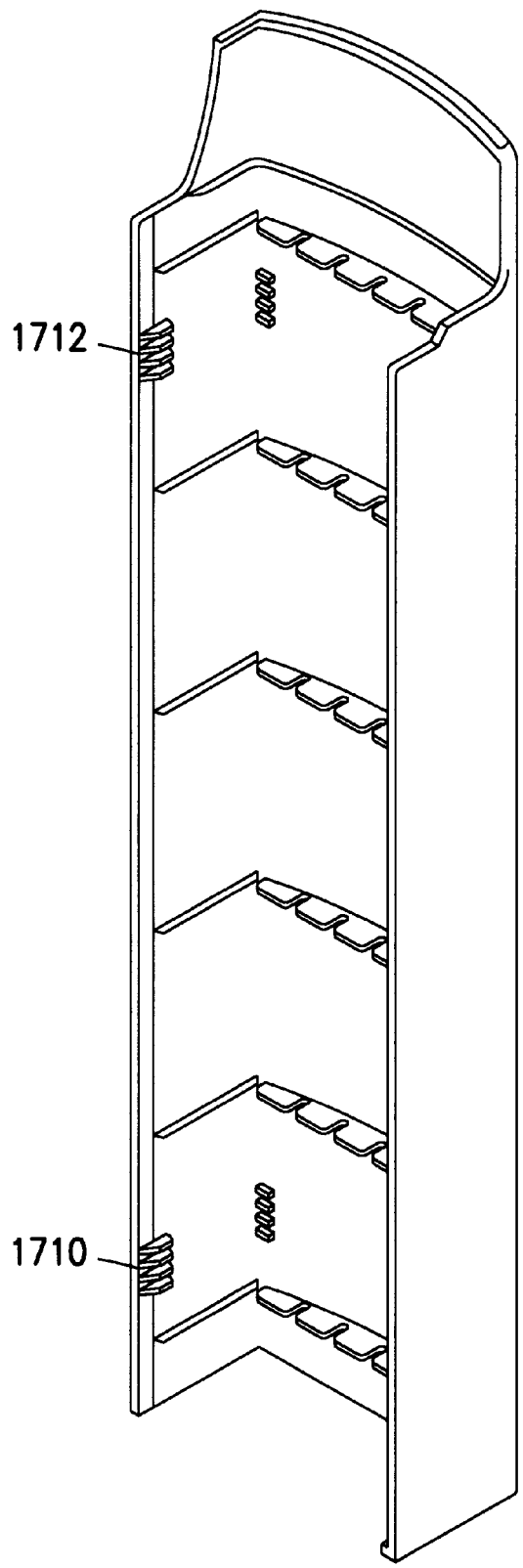
FIG. 17 is a perspective view of the cable comb cover of the computer system.

The cables also need to be supported during horizontal runs of the cables such as shown in FIG. 9 where cables are connected to port 909 on one end and port 909' on the other end. To support the cables during their horizontal runs, a device called a comb is used. A comb is associated with each of the frames which cables will cross. Now turning to FIG. 14, a comb 1400 is shown, which is carrying cables 1402. A cable comb is a container having a series of ledges for the cables. As shown in FIG. 14, the cable comb 1400 has a lower ledge 1410 and an upper ledge 1420 as well as several intermediate ledges. The cable comb 1400 is called a comb since the ledges are spaced and the structure does look somewhat like a common, ordinary hair comb. The back wall of the cable comb 1400 is curved. The curve is used to accommodate cable slack while controlling the minimum cable bend radius. The curved feature allows use of common cable lengths for different cable runs and minimizes the number of discrete cables required. Now turning to FIGS. 15 and 16, a front and side view of the cable comb 1400 is shown. The comb blades or individual ledges have a straight front. As shown in FIG. 15, the comb 1400 includes an upper ledge 1420 and a lower ledge 1410 as well as a plurality of intermediate ledges. The upper ledge 1420 includes a pair of openings 1421 and 1422 near the back wall of the cable comb 1400. Similarly, the lower ledge includes a pair of openings 1411 and 1412 near the back sidewall of the cable comb. FIG. 16 is a cross-sectional view of the cable comb 1400 shown in FIG. 15. FIG. 16 details the back sidewall 1600 of the cable comb 1400. An intermediate ledge is also shown in the cross-sectional view of FIG. 16. As can be seen in the cross-sectional view, the intermediate ledge 1430 has a flat portion. Attached to the back wall 1600 are features 1602 and 1604. These are an integral spring finger and alignment finger, respectively. There are four spring fingers and two alignment fingers integral to the comb. They engage the mounting plate 1650 shown in view. The features 1602 and 1604 fit within a mounting plate that is attached to the front face of the computer. The mounting plate 1650 on the frame of the computer is also an airflow plenum beneath the compute modules as shown in FIG. 2.

The final portion of the cable comb is a cover or a cable comb cover shown installed in FIG. 11. The cable comb cover is a C-shaped cover which covers the cable comb 1400. The cable comb cover 1700 has two ends. All cable comb covers have two ends which allow the cables to pass through both ends of the cable comb 1400. The cable comb cover includes a square boss 1710 and a square boss 1712. Thus, after the cables have been run through the cable combs and are sitting upon the various ledges as shown in FIG. 9, the cable comb cover can be merely snapped into place to both protect the cables and also make the outer exterior of the computer system look more esthetically pleasing.

Thus, when the cable run is made, it will pass from a connector over a cable guide 1100, secured by a cable clip 1108 and into a corner post 106, past a pair of flaps 150, 152. The cable can then, if it is making a horizontal run, it may go through a cable comb and be placed inside some ledges on the cable comb, such as ledge 1430 shown in FIGS. 16 and 15. When it comes out of the cable comb, goes back into another corner post, past a pair of similar flaps 150, 151, makes its vertical run up to a position near a second cable guide which is positioned so that it terminates at one end near the connectors that it is to be connected to.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A computer housing comprising:
   a structural frame for holding a computer system further comprising:
   a first corner post frame member having a first substantially continuous recess therein along the length of the first corner frame member; and
   a second corner post frame member having a second substantially continuous recess therein along the length of the second corner frame member; and
   a resilient sheet dimensioned to fit between said first and second corner posts, said resilient sheet further comprising:
   a first edge having a feature for engaging a substantial portion of the first substantially continuous recess in said first corner post; and
   a second edge having a feature for engaging a substantial portion of the second substantially continuous recess in said second corner post to provide a fastenerless attachment of the resilient sheet to the first and second corner post, said resilient sheet shaped between the first edge and the second edge to produce a spring force on the first and the second edge when the resilient sheet is engaged with the first substantially continuous recess and the second substantially continuous recess.

2. The computer housing of claim 1 wherein the resilient sheet further comprises four corners, said resilient sheet having a relief on at least one of the corners.

3. The computer housing of claim 1 wherein the shape of the resilient sheet between the first edge and the second edge includes a curved surface between the first edge and the second edge, said curved surface being compressed as the resilient sheet is attached to the first recess of the first corner post and to the second recess of the second corner post, said curved surface producing a spring force on said first and second corner posts when positioned between said first and second corner post.

4. The computer housing of claim 3 wherein the resilient sheet is a formed plastic sheet.

5. The computer housing of claim 3 wherein the resilient sheet includes a foam backing attached to the resilient sheet.

6. The computer housing of claim 1 wherein the first recess of the first corner post mates with the first edge of the resilient sheet and wherein the second recess of the second corner post mates with second edge of the resilient sheet, each of the first recess and the second recess including an abutment surface and a feature recieving portion, said first and second edges of said resilient sheet abutting said first corner post abutment surface and said second corner post abutment surface.

7. A structure for housing a computer comprising:
a frame comprising:
a plurality of upright corner posts, each of the corner posts having at least one elongated recesses therein;
a plurality of cross members positioned between the corner posts;
a computing unit held within the frame; and
a cover positioned between two of the corner posts, said cover formed from a sheet of plastic, said cover further comprising:
at least two edges each formed with a lip, each lip including a flange for engaging at least one elongated recess; and
a main body portion shaped to produce a force at the two edges of the cover when the lips of the at least two edges are held in compression between at least two of the plurality of corner posts each of said flanges engaged within a recess of one of the corner posts.

8. The cover for a computer housing of claim 7 wherein the main body portion has a curve therein which acts like a spring when the main body portion is compressed between said two edges.

9. The cover for a computer housing of claim 8 wherein the main body portion produces a spring force acting on said two edges.

10. The cover for a computer housing of claim 8 wherein the main body produces a force acting and at the flanges when the flanges are held in place each edge having a lip which also produces a force when the flanges are held in place.

11. The cover for a computer housing of claim 10 wherein the force produced by the main body portion is larger that the force produced by the lip.

12. The cover for a computer housing of claim 8 wherein the sheet of plastic further comprises a foam backing.

13. The cover for a computer housing of claim 12 wherein the sheet of plastic further comprises an integral pigment and texture.

14. The cover for a computer housing of claim 12 wherein the sheet of plastic further comprises a metalized portion for EMI protection.

15. The cover for a computer housing of claim 7 wherein the flange of the plastic sheet further includes a feature for engaging one of the recesses in one of the corner posts.

16. A computer housing comprising:
a structural frame further comprising:
a first corner post; and
a second corner post, each of said corner posts having a first feature; and:
a resilient sheet further comprising:
a first edge;
a second edge; and
a body portion positioned between the first edge and second edge, each edge including a second feature, said second feature for matingly engaging the first feature in said corner post, said body portion having a shape between the edges that produces a springlike force on the first and second corner post, said first feature and said second feature providing a force counteracting a separating force to maintain the resilient sheet between the first and second corner post when the first feature engages the second feature; and
a computing unit housed within the structural frame and covered in part by said resilient sheet.

17. The computer housing of claim 16 wherein the first feature is intermediate the width of the corner posts.

18. The computer housing of claim 16 wherein the resilient sheet is formed of plastic.

19. A housing for a machine comprising:
a structural frame further comprising:
a first corner post; and
a second corner post, each of said corner posts having an elongated recess therein;
a portion of a computing unit housed within the structural frame; and
a resilient sheet dimensioned to fit between said first and second corner posts, said resilient sheet further comprising a first edge and a second edge, each edge including an elongated feature, each elongated feature engaging the elongated recess in said corner post to provide a fastenerless attachment of the resilient sheet to the first and second corner post, said resilient sheet having a shape between the first edge and the second edge which produces a force at the first edge and the second edge when the elongated features are engaged within the elongated recesses at the corner post.

20. The housing of claim 19 wherein the resilient sheet has at least four corners, said resilient sheet including a relief at the corners.

21. The housing of claim 20 wherein the resilient sheet is a formed plastic sheet.

22. The housing of claim 20 wherein the resilient sheet includes a foam backing attached to the plastic panel.

23. The housing of claim,19 wherein the resilient sheet includes a curved surface between the first edge and the second edge, said curved surface being compressed when the resilient sheet is attached between the first corner post and the second corner post, said curved surface producing a spring force on said first and second corner posts when positioned between said first and second corner post.

* * * * *